United States Patent
Szczyrbowski et al.

Patent Number: 5,683,560
Date of Patent: Nov. 4, 1997

[54] CATHODE ASSEMBLY

[75] Inventors: Joachim Szczyrbowski, Goldbach; Dietmar Marquardt, Erlensee, both of Germany

[73] Assignee: Balzers und Leybold Deutschland Holding AG, Hanau, Germany

[21] Appl. No.: 676,499

[22] Filed: Jul. 8, 1996

Related U.S. Application Data

[63] Continuation-in-part of Ser. No. 554,751, Nov. 7, 1995, Pat. No. 5,616,226.

[30] Foreign Application Priority Data

Jul. 8, 1995 [DE] Germany .................. 195 25 007.9

[51] Int. Cl.$^6$ .................................................. C23C 14/34
[52] U.S. Cl. .................. 204/298.23; 204/298.12; 204/298.19; 204/298.2
[58] Field of Search ....................... 204/298.12, 298.16, 204/298.19, 298.2, 298.23

[56] References Cited

U.S. PATENT DOCUMENTS 5,292,419  3/1994  Moses et al. ............... 204/298.23
5,421,978  6/1995  Schuhmacher et al. ........... 204/298.19

FOREIGN PATENT DOCUMENTS 0549854  7/1993  European Pat. Off. .
4010495  10/1991  Germany .
4311360  10/1994  Germany .

OTHER PUBLICATIONS

Hieber, K. "Radio Frequency Sputter Deposition of Alloy Films" Siemens Forsch, Ber. Bd. 11, 1982 No. 3 pp. 145–148.

Takakazu, Tadahishi et al. "High Rate and Low Temperature Deposition of Co–Cr Films" Jap. Journal of Applied Physics, vol. 24 No. 9 (1985).

Primary Examiner—R. Bruce Breneman
Assistant Examiner—Rodney G. McDonald
Attorney, Agent, or Firm—Felfe & Lynch

[57] ABSTRACT

A magnetic yoke (22,23) carrying rows of permanent magnets (33,34) and a target (49,50) is connected to a top plate (41,42) by spring bolts (67) which urge the yoke toward the top plate. Rotatable cams (43,44) between the top plate and the yoke are used to adjust the distance between the top plate and the yoke. Clamping bars (37,38) having a claw-like edge parts (59–66) limit the maximum distance and, in a preferred embodiment, hold the target against the yoke.

6 Claims, 5 Drawing Sheets

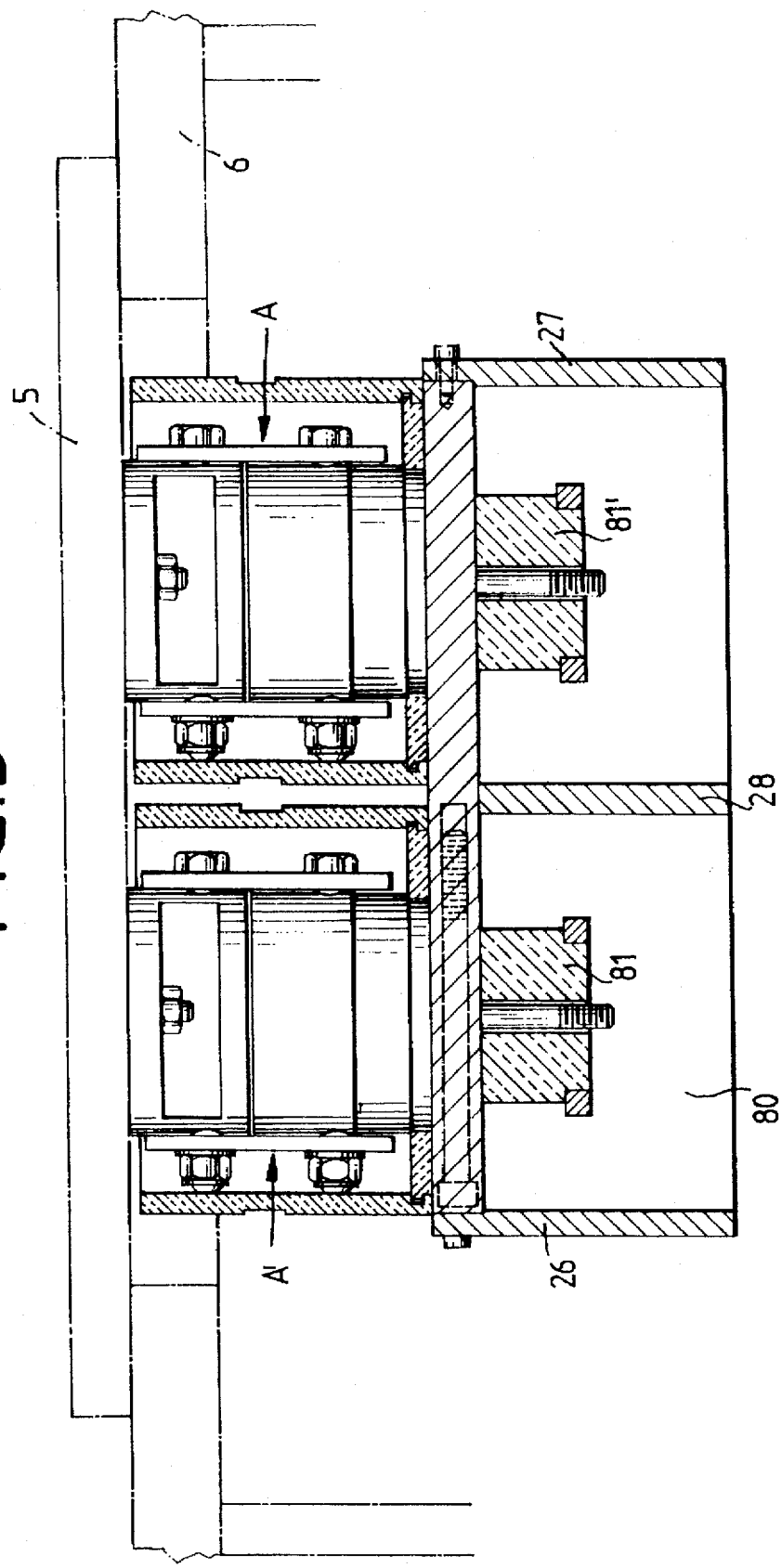

CATHODE ASSEMBLY

This application is a continuation-in-part of U.S. application Ser. No. 08/554,751 filed Nov. 7, 1995, now U.S. Pat. No. 5,616,226, incorporated herein by reference.

BACKGROUND OF THE INVENTION

The invention pertains to a cathode assembly for an apparatus for sputtering a target, with a magnetic yoke, permanent magnets between the target and the magnetic yoke, and a bracket for attaching the magnetic yoke to a part of the wall of the vacuum chamber.

SUMMARY OF THE INVENTION

The present invention provides a cathode for the sputtering of highly insulating materials, the outside surfaces of the cathode being almost completely free of irregularities such as screw ends, holes, and gaps. The invention makes it possible for the target to be replaced simply and quickly, without any special tools.

The side of the permanently mounted magnetic yoke facing away from the target rests against a cam or pair of cams. The cam or cam pair is supported for its part by a top plate, which is connected with play by a screw or spring bolt to the magnetic yoke. U-shaped claw or clamping bars are provided on both sides of the magnetic yoke, and the laterally projecting shanks of these bars or their claw-like edge portions extend beyond the top plate on one side and beyond the magnetic yoke and/or the target back plate on the other.

BRIEF DESCRIPTION OF THE DRAWINGS

FIG. 5 shows a transverse cross section through the cathode assembly according to FIG. 1, but in this case with the cathodes at some distance from the central plate.

DETAILED DESCRIPTION OF THE PREFERRED EMBODIMENTS

Figure 1:
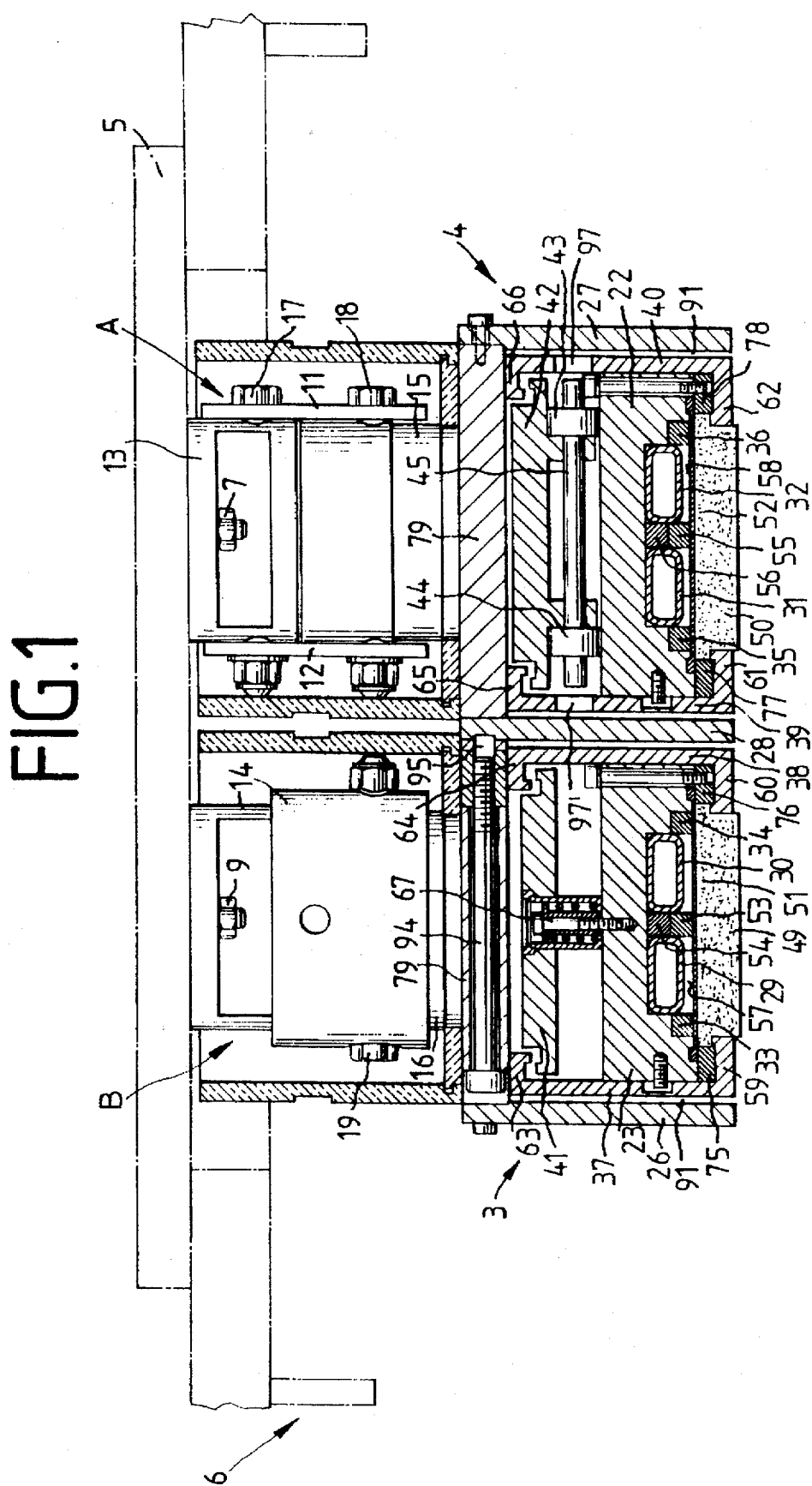
FIG. 1 shows a transverse cross section through a twin-cathode assembly according to the invention.
Figure 2:
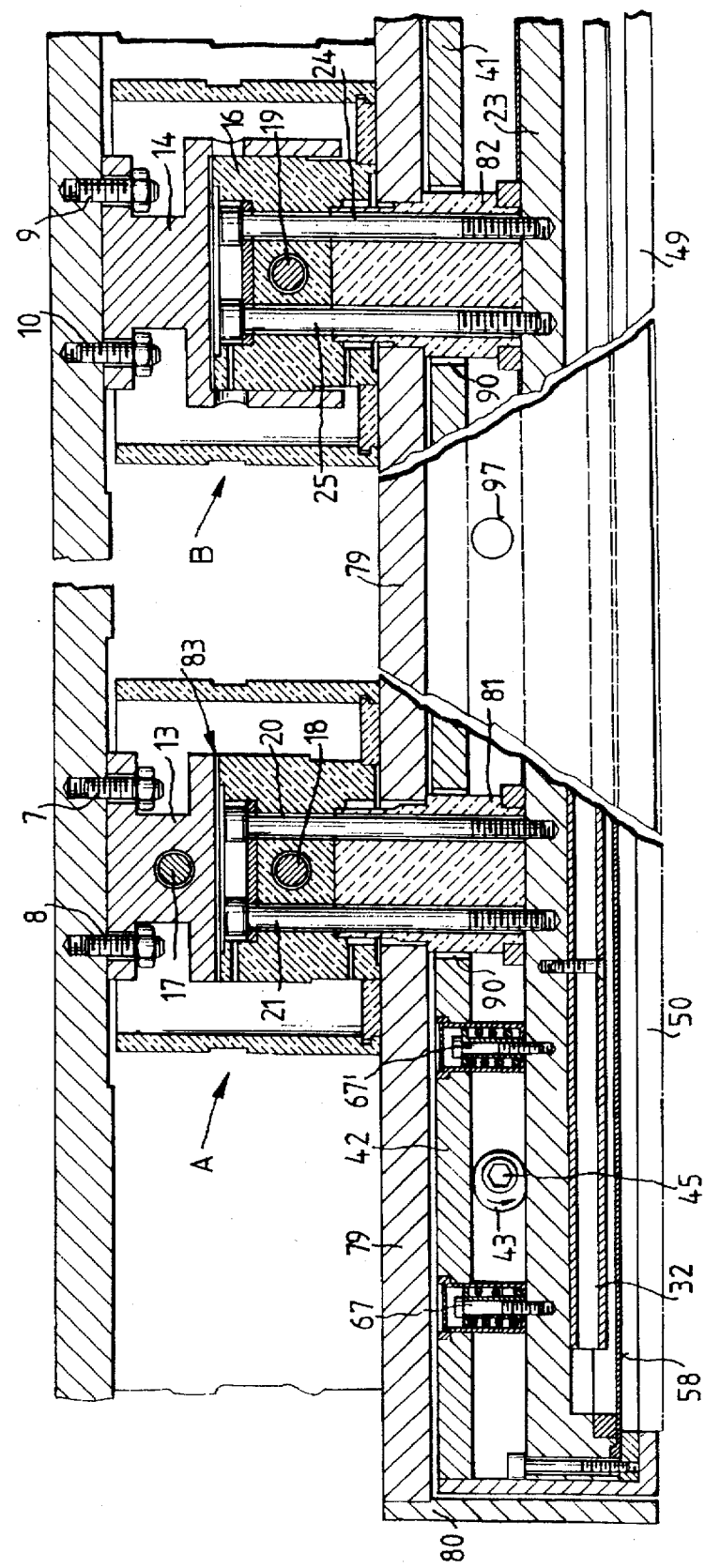
FIG. 2 shows a longitudinal cross section through the cathode assembly according to FIG. 1.
Figure 3:
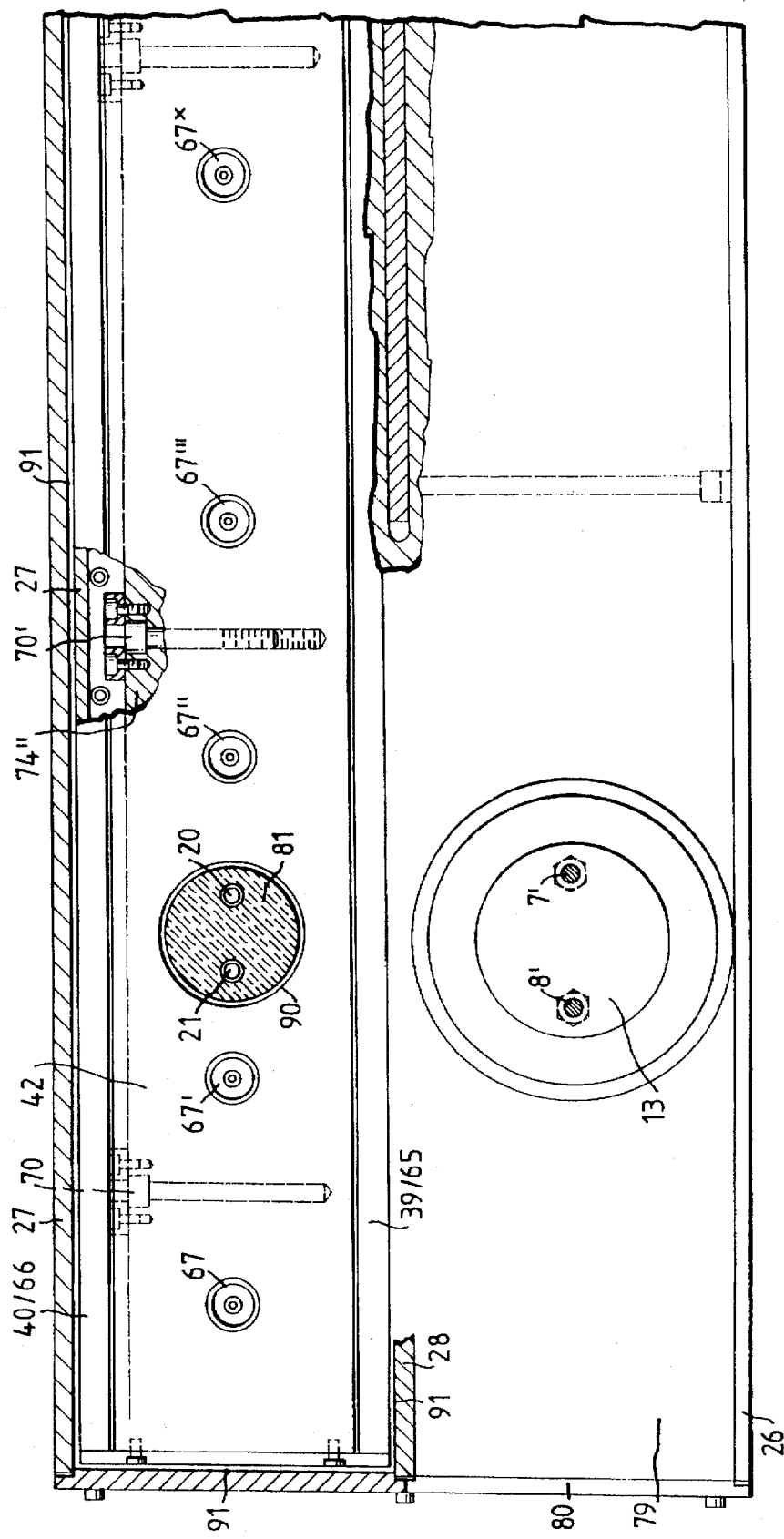
FIG. 3 shows a top view of the twin-cathode assembly according to FIGS. 1 and 2 in partial cross section.

Referring to FIGS. 1 and 2, two cathodes 3, 4 are attached by means of screws 7, 8; 9, 10 to a section 5 of the upper wall of a vacuum chamber 6. The cathodes 3, 4 themselves are coupled to bearing blocks 13 by pairs of brackets 11, 12 and to insulators 15 by screws 17, 18. Alternatively insulators 16 can be connected directly by screws 9 to bearing blocks 14. Insulators 15, 16 are in turn screwed by means of stud bolts 20, 21; 24, 25 to magnetic yoke 22, 23, so that cathodes 3, 4, together with the side plates 26, 27, 28 enclosing them, magnetic yoke 22, 23, cooling pipes 29, 30, 31, 32, permanent magnets 33, 34; 35, 36; 53, 54; 55, 56, clamping bars 37, 38; 39, 40, top plates 41, 42, cams 43, 44 with cam shaft 45, spring bolts 67, 67', and targets 49, 50 with their back plates 51, 52 are suspended from upper part 5 of the wall.

Targets 49, 50 and their back plates 51, 52 are pressed by clamping bars 37–40 against membranes 57, 58. This is possible because bottom edges 59–62 of the bars, i.e., the edges facing the substrate, extend over backing plates 51, 52 and are thus able to draw them firmly against magnetic yokes 22, 23. In addition, top edges 63–66 of the bars, i.e., the edges facing away from the back plates, extend over top plates 41, 42, each of which is otherwise connected by screws 67, 67' to magnetic yokes 22, 23.

To couple targets 49, 50 solidly to magnetic yokes 22, 23, cam shafts 45, 45', are rotated until top plates 41, 42 rest firmly against upper edge 63–66 and lower edges 59–62 rest firmly against spacer bars 75–78 and thus all of the parts gripped by clamping bars 37–40 are connected solidly together. Because bearing blocks 13, 14 are permanently connected to magnetic yokes 22, 23 by means of screws 20, 21; 24, 25, the yokes are supported by upper wall part 5 of vacuum chamber 6. Simultaneously, cover plate 79 is supported on insulators 81, 82, which are fastened in turn by screws 20, 21; 24, 25. Because a gap 83 is provided between bearing block 13 and insulator 15, cathodes 3, 4 can execute a certain amount of motion in the horizontal plane (because insulators 15, 16 on the one side and bearing blocks 13, 14 on the other are connected in an articulated manner by way of brackets 11, 12 and screws 17, 18 and thus act like the links of a chain), as opposed to the suspension shown on the right in FIG. 2. Cathodes 3, 4 are very long; each of the two long cathodes 3, 4 is attached to upper wall part 5 by several hangers of type A (as shown in FIG. 2) distributed over the length of the cathode and by one hanger of type B (as shown on the right in FIG. 2).

Because of the enveloping design, the cathode body is shielded from the sputtered material, and no layers can be deposited on it. The claw bars or clamping bars 37–40 hold and clamp target 49, 50 in a form-locking manner against membranes 57, 58. Each row of clamping bars is made up of separate sections, and because each section is fastened separately, controlled longitudinal expansion can occur even though gaps 90, 91 are extremely small. The side facing the substrate is smooth and prevents local process instabilities, in particular arcing.

Because so many screws have been eliminated and because the targets can be removed simply by the use of an Allen wrench to rotate shafts 45, 45', the targets can be replaced very quickly.

Figure 4:
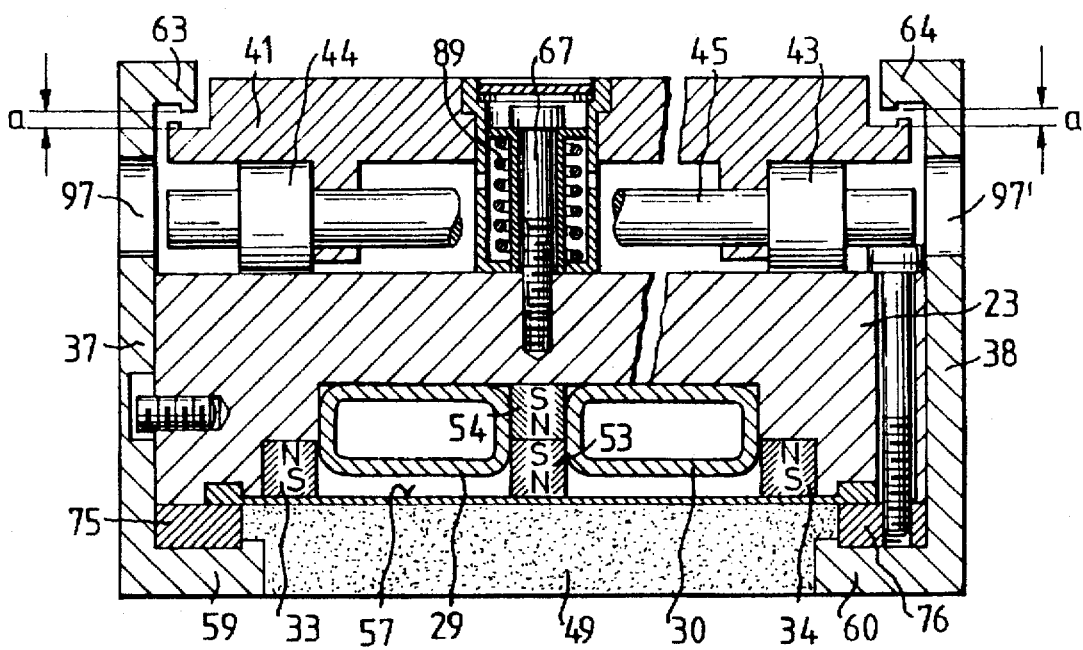
FIG. 4 shows a transverse cross section through a cathode on an enlarged scale.

The locking and clamping functions are accomplished by shafts 45, 45', which are supported rotatably on top plates 41, 42. Cams or eccentric disks 43, 43', are rigidly mounted on these shafts and rest on the top sides of magnetic yokes 22, 23. The height of the cams or their eccentricity is calculated in such a way that it corresponds at least to a gap with a dimension of "a"(see FIG. 4). So that a tool suitable for turning shafts 45, 45', can be introduced into the ends of shafts 45, 45', access holes 97, 97', are provided in clamping bars 37, 38; 39, 40. To release the assembly, the shafts are rotated in the opposite direction, and cover plates or top plates 41, 42 are raised by the force of springs, and clamping bars 37–40 are released. It is advantageous for the shafts to be actuated on the outward-facing side of the cathode. This reduces the danger of damage to the target during a replacement operation. The possibility of a coating being deposited on the screws is also minimized, and it is ensured that the target can be replaced easily.

What is claimed is:

1. Cathode sputtering apparatus comprising
   a magnetic yoke which carries permanent magnets and a target,
   a top plate extending parallel to said yoke to form an assembly having parallel sides,
   spring means urging said magnetic yoke toward said top plate, rotatable cam means between said top plate and said yoke, said rotatable cam means being effective to move the top plate and the magnetic yoke away from each other against the urging of the spring means, thereby to adjust the distance between said top plate and said yoke when rotated, and bracket means effective to limit the movement of the magnetic yoke away from said top plate.

2. Cathode sputtering apparatus as in claim 1 wherein said spring means comprises spring bolt means which also serves to connect said magnetic yoke to said top plate.

3. Cathode sputtering apparatus as in claim 1 wherein said bracket means comprises at least one clamping bar on each side of said assembly, each clamping bar having a claw-like edge part extending over the top plate and a claw-like edge part extending over the magnetic yoke.

4. Cathode sputtering apparatus as in claim 3 wherein said claw-like edge parts extending over the yoke also extend over the target and hold said target against said yoke, whereby rotation of said cam means to a release position permits ready removal of said target from said assembly.

5. Cathode sputtering apparatus as in claim 3 wherein said at least one clamping bar on at least one side has an access hole aligned with said cam means to effect rotation of said cam means.

6. Cathode sputtering apparatus as in claim 1 wherein said cam means comprises at least one cam shaft journaled to said top plate.

* * * * *